(12) United States Patent
Jung

(10) Patent No.: US 9,418,718 B2
(45) Date of Patent: *Aug. 16, 2016

(54) SEMICONDUCTOR APPARATUS WITH CLOCK CONTROL

(71) Applicant: SK hynix Inc., Icheon-si Gyeonggi-do (KR)

(72) Inventor: Jong Ho Jung, Icheon-si (KR)

(73) Assignee: Sk hynix Inc., Icheon-si, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 14/705,106

(22) Filed: May 6, 2015

(65) Prior Publication Data

US 2015/0235684 A1    Aug. 20, 2015

Related U.S. Application Data

(63) Continuation of application No. 13/974,497, filed on Aug. 23, 2013, now Pat. No. 9,058,864.

(30) Foreign Application Priority Data

May 16, 2013  (KR) .................. 10-2013-0055481

(51) Int. Cl.
*G11C 7/22*    (2006.01)
*G11C 11/4076*    (2006.01)

(52) U.S. Cl.
CPC ............ *G11C 7/222* (2013.01); *G11C 11/4076* (2013.01)

(58) Field of Classification Search
CPC ............ G11C 7/22; G11C 7/222; G11C 8/18; G11C 11/4076
See application file for complete search history.

(56) References Cited

U.S. PATENT DOCUMENTS

| | | | | |
|---|---|---|---|---|
| 6,232,813 B1 * | 5/2001 | Lee | ........................ | H03K 5/133 327/158 |
| 8,009,486 B2 * | 8/2011 | Kim | ........................ | G11C 7/22 365/189.05 |
| 9,058,864 B2 * | 6/2015 | Jung | ...................... | G11C 7/222 |

* cited by examiner

*Primary Examiner* — Harry W Byrne
*Assistant Examiner* — R Lance Reidlinger
(74) *Attorney, Agent, or Firm* — William Park & Associates Ltd.

(57) ABSTRACT

A semiconductor apparatus includes: a command control unit configured to decode external signals and generate a read strobe signal or a write strobe signal; a clock enable signal generation unit configured to activate one of a read clock enable signal and a write clock enable signal in response to the read strobe signal or the write strobe signal; and a clock control unit configured to generate a first control clock signal and a second clock control signal in response to an internal clock signal, the read clock enable signal, and the write to clock enable signal.

18 Claims, 11 Drawing Sheets

FIG.2
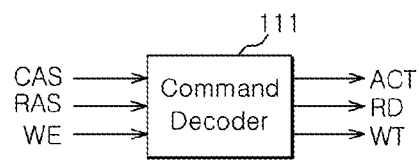
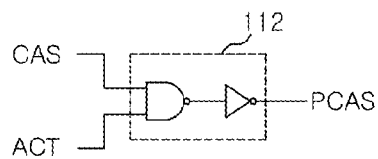
FIG.3
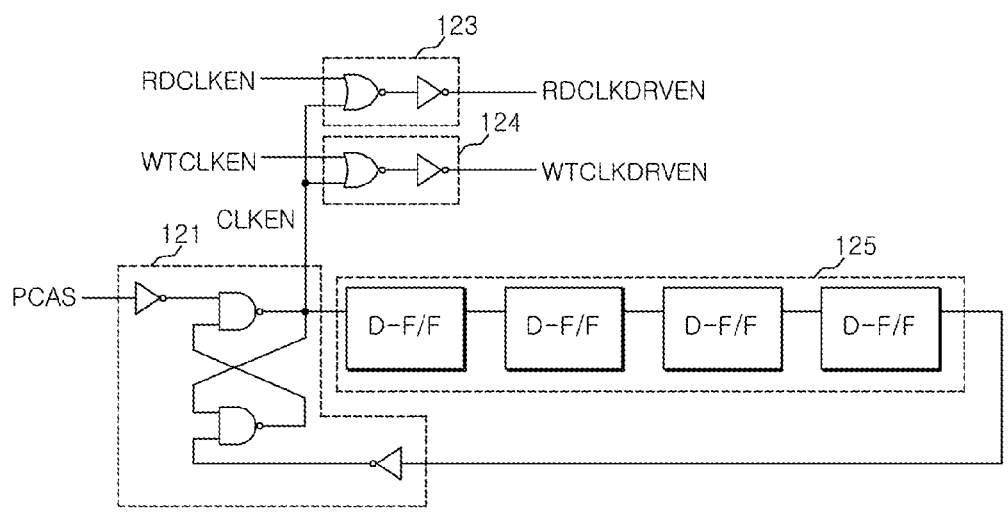

FIG.9
202
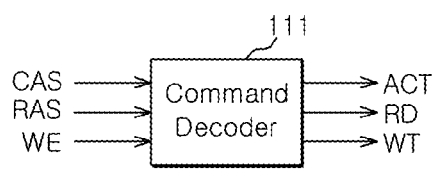
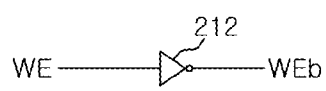
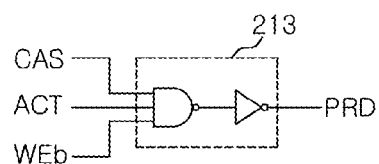
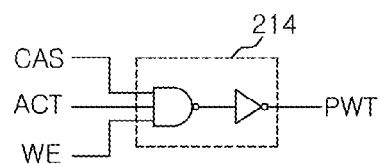

SEMICONDUCTOR APPARATUS WITH CLOCK CONTROL

CROSS-REFERENCES TO RELATED APPLICATION

The application is a continuation of U.S. patent application Ser. No. 13/974,497, filed on Aug. 23, 2013 which is incorporated herein by reference in its entirety.

BACKGROUND

1. Technical Field

Various embodiments relate to a semiconductor apparatus.

2. Related Art

A semiconductor apparatus may require a domain crossing operation to compensate for an error between data output is timing based on an external clock signal and actual data output timing by operation delay of an internal circuit.

SUMMARY

Various embodiments are directed to a semiconductor apparatus capable of reducing current consumption.

In an embodiment of the present invention, a semiconductor apparatus includes: a command control unit configured to decode external signals and generate a read strobe signal or a write strobe signal; a clock enable signal generation unit configured to activate one of a read clock enable signal and a write clock enable signal in response to the read strobe signal or the write strobe signal; and a clock control unit configured to generate a first control clock signal and a second clock control signal in response to an internal clock signal, the read clock enable signal, and the write clock enable signal.

The semiconductor apparatus may further include a delay locked loop (DLL) configured to receive an external clock signal and generate the internal clock signal for compensating for an internal signal processing delay time of the semiconductor apparatus.

The semiconductor apparatus may further include: a transmission unit configured to perform a data driving operation corresponding to the read command; and a termination control unit configured to control termination of the transmission unit during read and write operations of the semiconductor apparatus, in response to the first control clock signal, the first latency signal, and the second latency signal.

The command control unit may be configured to active only the read strobe signal between the read strobe signal and the write strobe signal during the read operation of the semiconductor apparatus.

The clock control unit may be configured to output a clock signal, which corresponds to an activation period of the read clock enable signal in the internal clock signal, as the first control clock signal during the read operation of the semiconductor apparatus.

In an embodiment of the present invention, a semiconductor apparatus includes: a delay locked loop (DLL) configured to receive an external clock signal and generate a DLL clock signal; a command control unit configured to decode external signals and generate a read strobe signal, a write strobe signal, a read command, and a write command; a clock enable signal generation unit configured to generate a read clock enable signal and a write clock enable signal in response to a read strobe signal, a write strobe signal, a read period signal, and a write period signal; a clock control unit configured to generate a plurality of control clock signals in response to the DLL clock signal, the read clock enable signal, and the write clock enable signal; and a delay unit configured to delay the read command and the write command and output the delayed read command and the delayed write command.

In an embodiment of the present invention, a semiconductor apparatus includes: a delay locked loop (DLL) configured to receive an external clock signal and generate an internal clock signal for compensating for an internal signal processing delay time; a clock enable signal generation unit configured to generate a read clock enable signal and a write clock enable signal in response to a read strobe signal, a write strobe signal, a read period signal, and a write period signal; a clock control unit configured to generate at least one control clock signal in response to the internal clock signal, the read clock enable signal, and the write clock enable signal; and a delay unit configured to delay the read command and the write command by a predetermined period and output the delayed read command and the delayed write command.

BRIEF DESCRIPTION OF THE DRAWINGS

Features, aspects, and embodiments are described in conjunction with the attached drawings, in which:

FIG. 2 is a circuit diagram of a command control unit 102 of FIG. 1;

FIG. 3 is a circuit diagram of a clock enable signal generation unit 103 of FIG. 1;

FIG. 9 is a circuit diagram of a command control unit 202 of FIG. 8;

DETAILED DESCRIPTION

Hereinafter, a semiconductor apparatus according to the present invention will be described below with reference to the accompanying drawings through various embodiments.

Figure 1:
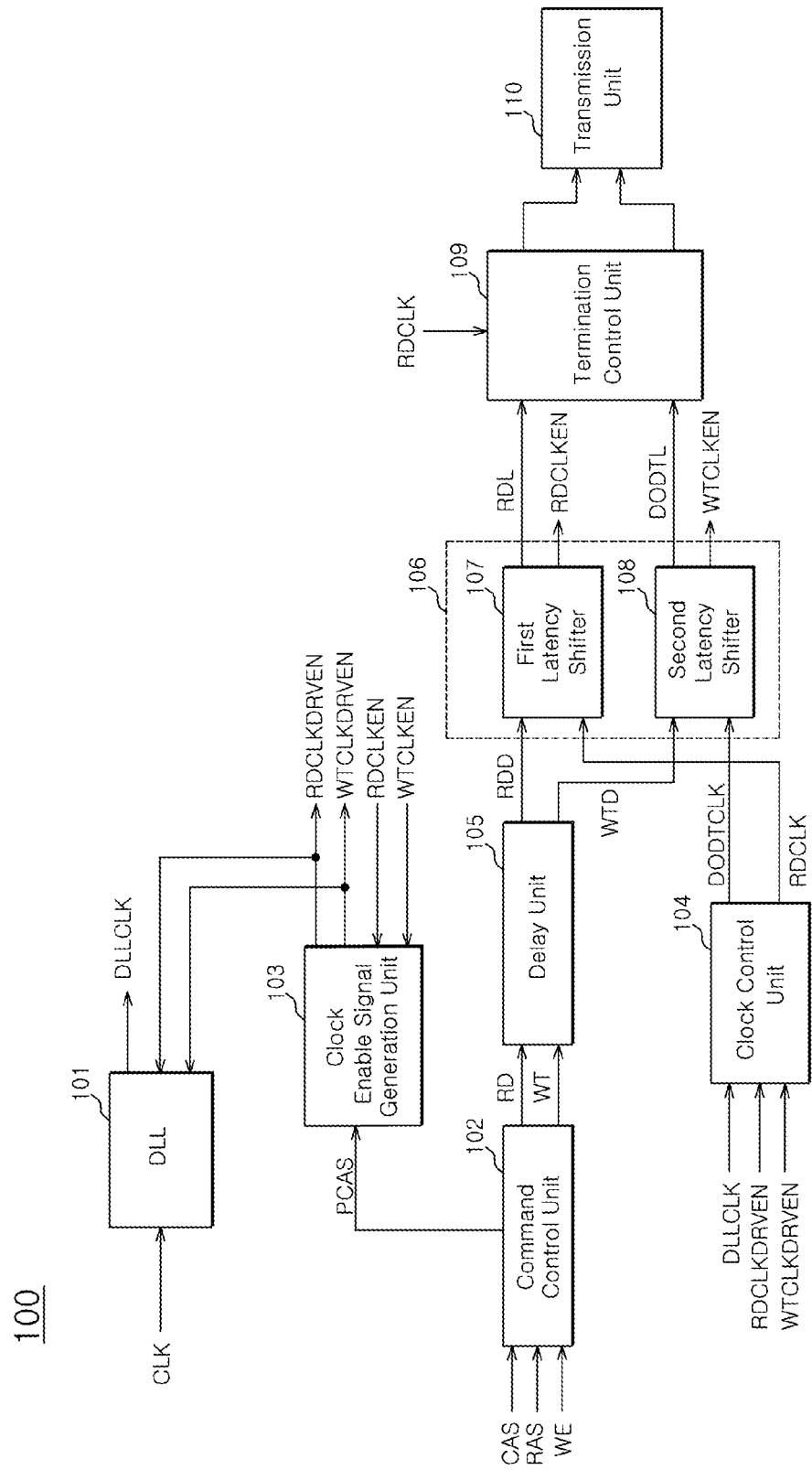
FIG. 1 is a block diagram of a semiconductor apparatus 100 according to an embodiment of the present invention.

FIG. 1 is a block diagram of a semiconductor apparatus 100 according to an embodiment of the present invention.

Referring to FIG. 1, the semiconductor apparatus 100 according to an embodiment of the present invention may include a delay locked loop (DLL) 101, a command control unit 102, a clock enable signal generation unit 103, a clock control unit 104, a variable delay unit 105, a latency shift unit 106, a termination control unit 109, and a transmission unit 110.

The DLL 101 may be configured to receive an external clock signal CLK and generate an internal clock signal for compensating for an internal signal processing delay time of the semiconductor apparatus, that is, a DLL clock signal DLLCLK.

The command control unit 102 may be configured to decode external signals CAS, RAS, and WE and generate a read/write strobe signal PCAS, a read command RD, and a write command WT.

CAS represents a column address strobe signal, RAS represents a row address strobe signal, and WE represents a write enable signal.

The clock enable signal generation unit 103 may be configured to generate a read clock enable signal RDCLKDRVEN and a write clock enable signal WTCLKDRVEN in response to the read/write strobe signal PCAS, a read period signal RDCLKEN, and a write period signal WTCLKEN.

The clock control unit 104 may be configured to generate a first control clock signal RDCLK and a second control clock signal DODTCLK in response to the DLL clock signal DLLCLK, the read clock enable signal RDCLKDRVEN, and the write clock enable signal WTCLKDRVEN.

The delay unit 105 may be configured to delay the read command RD and the write command WT by a predetermined time and output the delayed read command RDD and the delayed write command WTD.

At this time, the delay time of the delay unit 105 may be set to the same value as a delay time which is internally adjusted in the DLL 101.

The latency shift unit 106 may include a first latency shifter 107 and a second latency shifter 108.

The first latency shifter 107 may be configured to generate a first latency signal RDL and the read period signal RDCLKEN in response to the delayed read command RDD and the first control clock signal RDCLK.

The second latency shifter 108 may be configured to generate a second latency signal DODTL and the write period signal WTCLKEN in response to the delayed write command WTD and the second control clock signal DODTCLK.

The transmission unit 110 may be configured to perform a data driving operation corresponding to the read command RD.

The termination control unit 109 may be configured to control termination of the transmission unit 110 during read and write operations of the semiconductor apparatus, in response to the first control clock signal RDCLK, the first latency signal RDL, and the second latency signal DODTL.

The termination control unit 109 may be configured to control on-die termination of the transmission unit 110 in response to the first control clock signal RDCLK and the first latency signal RDL, during the read operation of the semiconductor apparatus.

The termination control unit 109 may be configured to control dynamic on-die termination of the transmission unit 110 in response to the second latency signal DODTL, during the write operation of the semiconductor apparatus.

FIG. 2 is a circuit diagram of the command control unit 102 of FIG. 1.

Referring to FIG. 2, the command control unit 102 may include a command decoder 111 and a logic circuit 112.

The command decoder 111 may be configured to decode the column address strobe signal CAS, the row address strobe signal RAS, and the write enable signal WE and generate an active command ACT, a read command RD, and a write command WT.

The logic circuit 112 may be configured to perform an AND operation on the active command ACT and the column address strobe signal CAS and generate the read/write strobe signal PCAS.

FIG. 3 is a circuit diagram of the clock enable signal generation unit 103 of FIG. 1.

Referring to FIG. 3, the clock enable signal generation unit 103 may include a latch 121, logic circuits 123 and 124, and a flip-flop array 125.

The latch 121 may be configured to set an enable signal CLKEN in response to the read/write strobe signal PCAS and reset the enable signal CLKEN after a delay time by the flip-flop array 125 that may include a plurality of flip-flops D-F/F.

The logic circuit 123 may be configured to perform an OR operation on the enable signal CLKEN and the read period signal RDCLKEN and generate the read clock enable signal RDCLKDRVEN.

The logic circuit 124 may be configured to perform an OR operation on the enable signal CLKEN and the write period signal WTCLKEN and generate the write clock enable signal WTCLKDRVEN.

Figure 4:
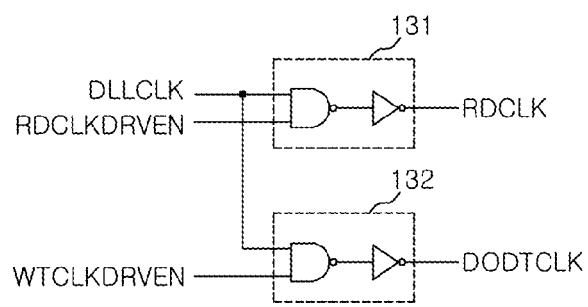
FIG. 4 is a circuit diagram of a clock control unit 104 of FIG. 1.

FIG. 4 is a circuit diagram of the clock control unit 104 of FIG. 1.

Referring to FIG. 4, the clock control unit 104 may include logic circuits 131 and 132.

The logic circuit 131 may be configured to perform an AND operation on the read clock enable signal RDCLKDRVEN and the DLL clock signal DLLCLK and output the operation result as the first control clock signal RDCLK.

The logic circuit 132 may be configured to perform an AND operation on the write clock enable signal WTCLKDRVEN and the DLL clock signal DLLCLK and output the operation result as the second control clock signal DODTCLK.

Figure 5A:
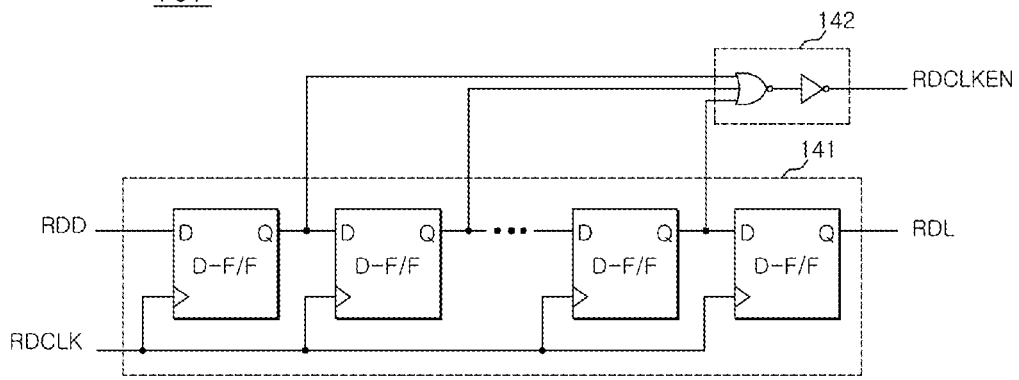
FIG. 5A is a circuit diagram of a first latency shifter 107 of FIG. 1.

FIG. 5A is a circuit diagram of the first latency shifter 107 of FIG. 1.

Referring to FIG. 5A, the first latency shifter 107 may include a shift section 141 and a logic circuit 142.

The shift section 141 may include a flip-flop array. The delayed read command RDD may be inputted to an input terminal D of the first flip-flop of the flip-flop array, and the first control clock signal RDCLK may be inputted to a clock terminal of each flip-flop D-F/F.

The shift section 141 may be configured to shift the delayed read command RDD according to the first control clock signal RDCLK and output the shifted signal as the first latency signal RDL.

The logic circuit 142 may be configured to perform an OR operation on output signals of the respective flip-flops excluding the last flip-flop of the flip-flop array of the shift section 141, and output the operation result as the read period signal RDCLKEN.

Figure 5B:
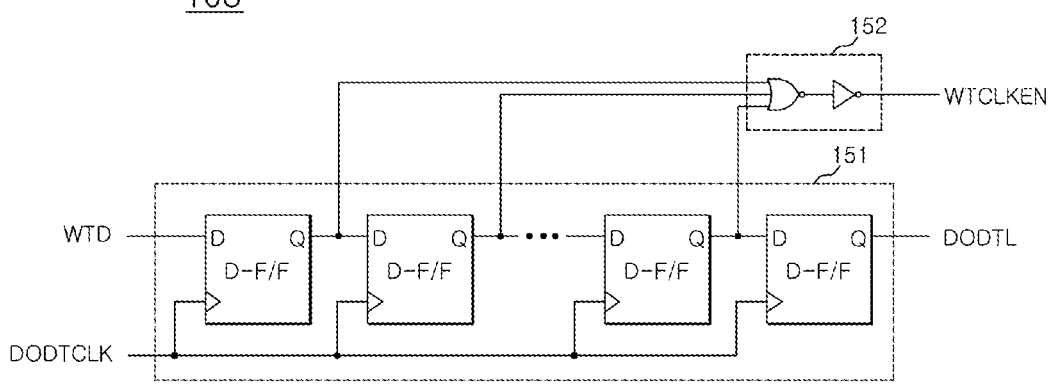
FIG. 5B is a circuit diagram of a second latency shifter 108 of FIG. 1.

Referring to FIG. 5B, the second latency shifter 108 may include a shift section 151 and a logic circuit 152.

The shift section 151 may include a flip-flop array. The delayed write command WTD may be inputted to an input terminal D of the first flip-flop of the flip-flop array, and the second control clock signal DODTCLK may be inputted to a clock terminal of each flip-flop D-F/F.

The shift section 151 may be configured to shift the delayed write command WTD according to the second control clock signal DODTCLK and output the shifted signal as the second latency signal DODTL.

The logic circuit 152 may be configured to perform an OR operation on output signals of the respective flip-flops excluding the last flip-flop of the flip-flop array of the shift section 151, and output the operation result as the write period signal WTCLKEN.

Figure 6:
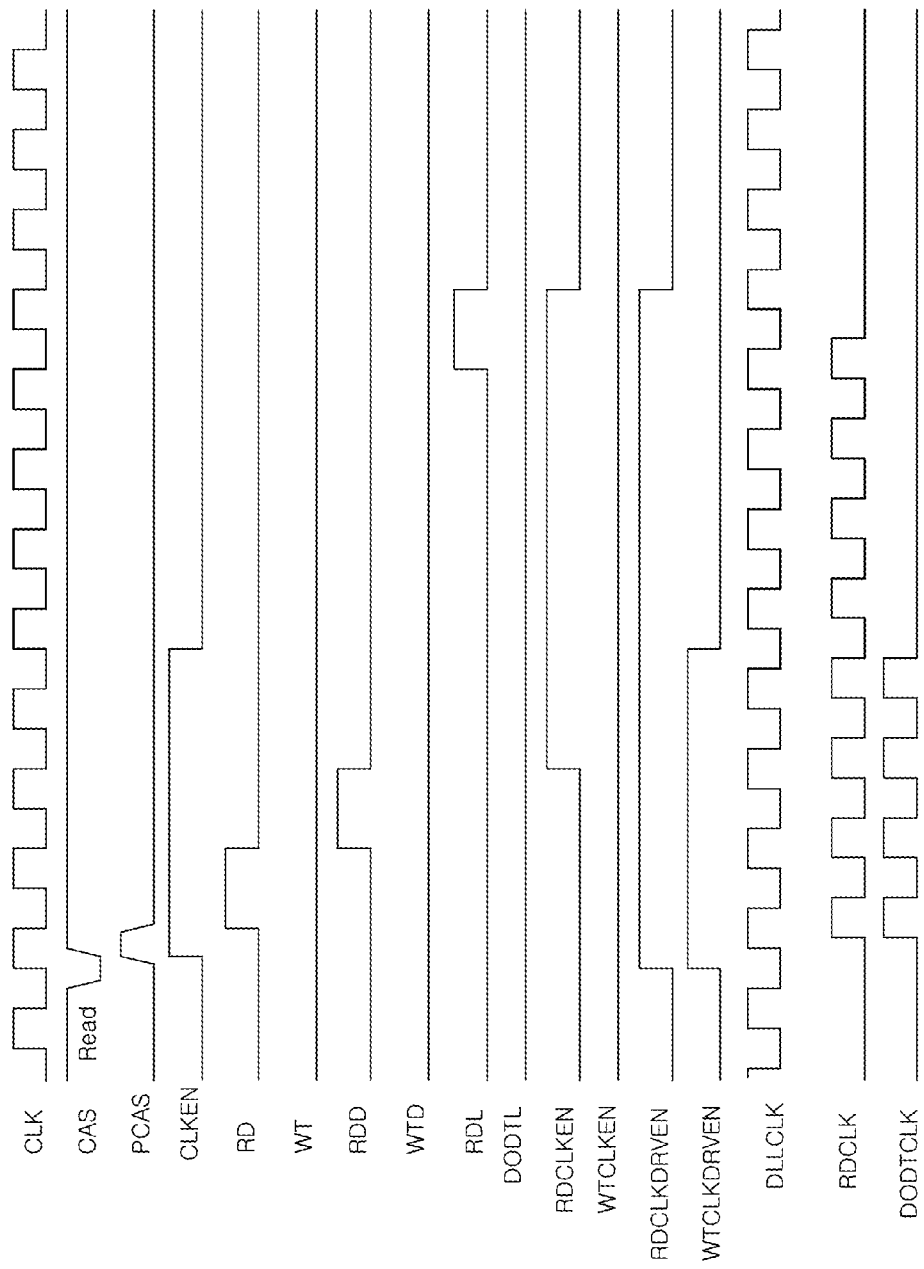
FIG. 6 is a timing diagram of a read operation based on FIG. 1.

FIG. 6 is a timing diagram of the read operation based on FIG. 1.

The read operation of the semiconductor apparatus 100 according to an embodiment of the present invention will be described with reference to FIG. 6.

When a combination of external signals CAS, RAS, and WE defines the read operation, the command control unit 102 may generate the read/write strobe signal PCAS and the read command RD.

The clock enable signal generation unit 103 may activate the enable signal CLKEN during a predetermined period, in response to the read/write strobe signal PCAS.

According to the enable signal CLKEN, the read clock enable signal RDCLKDRVEN and the write clock enable signal WTCLKDRVEN are activated.

The delay unit 105 may generate the delayed read command RDD in response to the read command RD.

The clock control unit 104 may output clock signals, which correspond to an activation period of the read clock enable signal RDCLKDRVEN in the DLL clock signal DLLCLK, as the first control clock signal RDCLK.

Furthermore, the clock control unit 104 may output clock signals, which correspond to an activation period of the write clock enable signal WTCLKDRVEN in the DLL clock signal DLLCLK, as the second control clock signal DODTCLK.

The first latency shifter 107 may shift the delayed read command RDD and generate the first latency signal RDL and the read period signal RDCLKEN.

At this time, the read clock enable signal RDCLKDRVEN may have a longer activation period than the write clock enable signal WTCLKDRVEN, according to the read period signal RDCLKEN.

That is, the read clock enable signal RDCLKDRVEN may have an activation period ranging from the activation start time of the read/write strobe signal PCAS to the activation end time of the first latency signal RDL.

The termination control unit 109 may control the termination of the transmission unit 110 during the read operation of the semiconductor apparatus, that is, on-die termination in response to the first latency signal RDL and the first control clock signal RDCLK.

Figure 7:
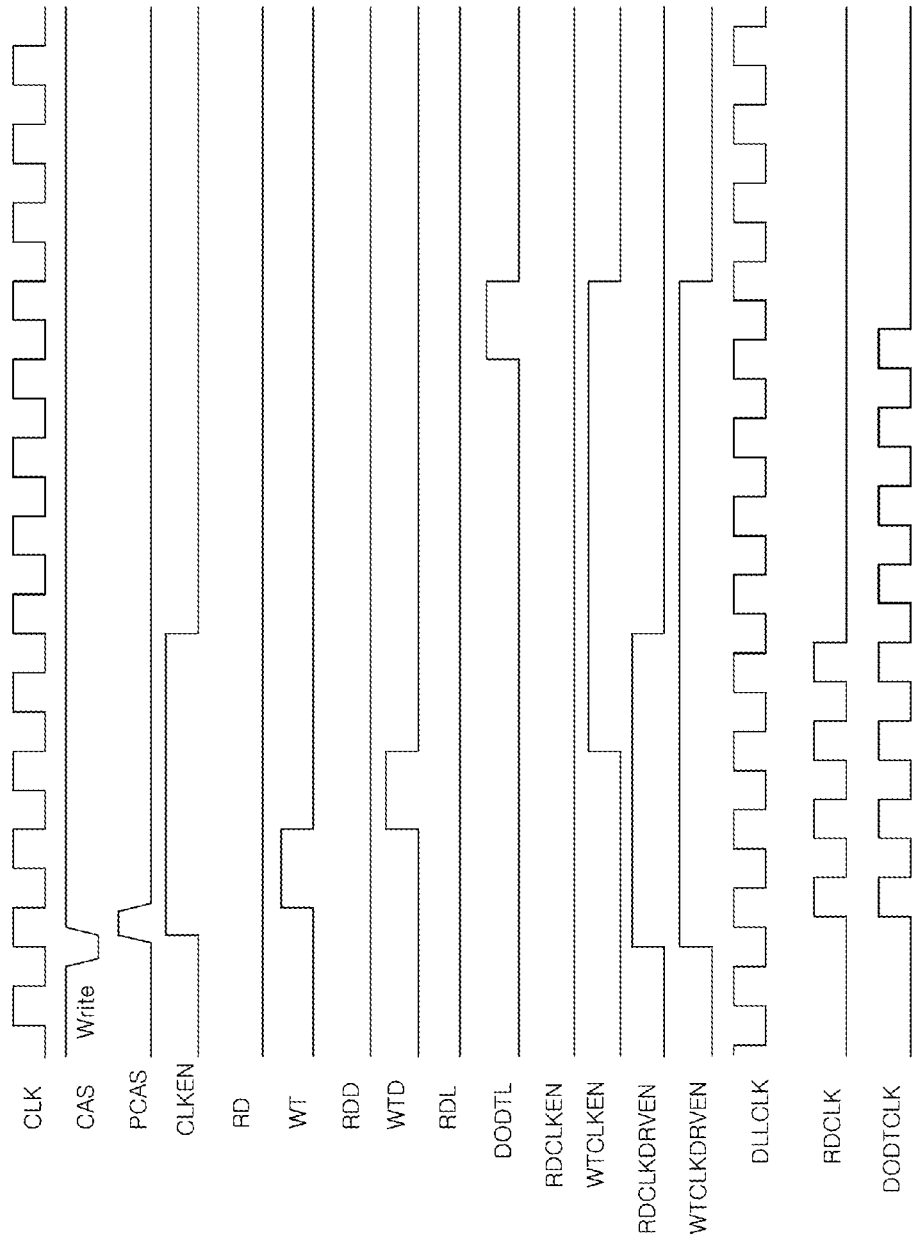
FIG. 7 is a timing diagram of a write operation based on FIG. 1.

FIG. 7 is a timing diagram of the write operation based on FIG. 1.

The write operation of the semiconductor apparatus 100 according to an embodiment of the present invention will be described with reference to FIG. 7.

When a combination of external signals CAS, RAS, and WE defines the write operation, the command control unit 102 may generate the read/write strobe signal PCAS and the write command WT.

The clock enable signal generation unit 103 may activate the enable signal CLKEN during a predetermined time, in response to the read/write strobe signal PCAS.

According to the enable signal CLKEN, the read clock enable signal RDCLKDRVEN and the write clock enable signal WTCLKDRVEN are activated.

The delay unit 105 may generate the delayed write command WTD in response to the write command WT.

The clock control unit 104 may output clock signals, which correspond to an activation period of the write clock enable signal WTCLKDRVEN in the DLL clock signal DLLCLK, as the second control clock signal DODTCLK.

Furthermore, the clock control unit 104 may output clock signals, which correspond to an activation period of the read clock enable signal RDCLKDRVEN in the DLL clock signal DLLCLK, as the first control clock signal RDCLK.

The second latency shifter 107 may shift the delayed write command WTD and generate the second latency signal DODTL and the write period signal WTCLKEN.

At this time, the write clock enable signal WTCLKDRVEN may have a longer activation period than the read clock enable signal RDCLKDRVEN, according to the write period signal WTCLKEN.

That is, the write clock enable signal WTCLKDRVEN may have an activation period ranging from the activation start time of the read/write strobe signal PCAS to the activation end time of the second latency signal DODTL.

The termination control unit 109 may control the termination of the transmission unit 110 during the write operation of the semiconductor apparatus, that is, dynamic on-die termination in response to the second latency signal DODTL and the second control clock signal DODTCLK.

Figure 8:
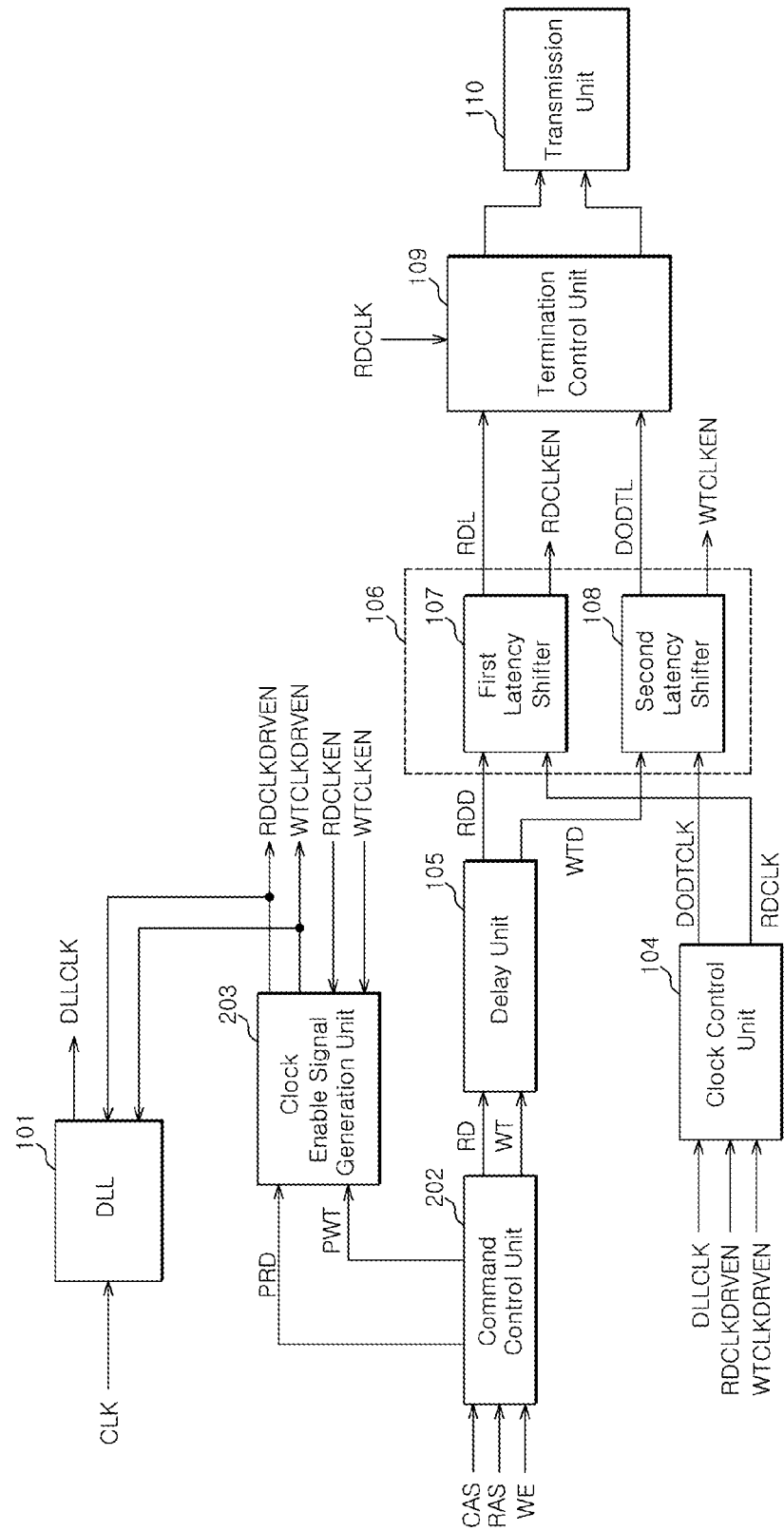
FIG. 8 is a block diagram of a semiconductor apparatus 200 according to an embodiment of the present invention.

FIG. 8 is a block diagram of a semiconductor apparatus 200 according to an embodiment of the present invention.

Referring to FIG. 8, the semiconductor apparatus 200 according to an embodiment of the present invention may include a DLL 101, a command control unit 202, a clock enable signal generation unit 203, a clock control unit 104, a variable delay unit 105, a latency shift unit 106, a termination control unit 109, and a transmission unit 110.

The DLL 101 may be configured to receive an external clock signal CLK and generate an internal clock signal for compensating for an internal signal processing delay time of the semiconductor apparatus, that is, a DLL clock signal DLLCLK.

The command control unit 202 may be configured to decode external signals CAS, RAS, and WE and generate a read strobe signal PRD, a write strobe signal PWT, a read command RD, and a write command WT.

CAS represents a column address strobe signal, RAS represents a row address strobe signal, and WE represents a write enable signal.

The clock enable signal generation unit 203 may be configured to generate a read clock enable signal RDCLKDRVEN and a write clock enable signal WTCLKDRVEN in response to the read strobe signal PRD, the write strobe signal PWT, a read period signal RDCLKEN, and a write period signal WTCLKEN.

The clock control unit 104 may be configured to generate a first control clock signal RDCLK and a second control clock signal DODTCLK in response to the DLL clock signal DLLCLK, the read clock enable signal RDCLKDRVEN, and the write clock enable signal WTCLKDRVEN.

The delay unit 105 may be configured to delay the read command RD and the write command WT by a predetermined time and output the delayed read command RDD and the delayed write command WTD.

At this time, the delay time of the delay unit 105 may be set to the same value as a delay time which is internally adjusted in the DLL 101.

The latency shift unit 106 may include a first latency shifter 107 and a second latency shifter 108.

The first latency shifter 107 may be configured to generate a first latency signal RDL and the read period signal RDCLKEN in response to the delayed read command RDD and the first control clock signal RDCLK.

The second latency shifter 108 may be configured to generate a second latency signal DODTL and the write period signal WTCLKEN in response to the delayed write command WTD and the second control clock signal DODTCLK.

The transmission unit 110 may be configured to perform a data driving operation corresponding to the read command RD.

The termination control unit 109 may be configured to control termination of the transmission unit 110 during read and write operations of the semiconductor apparatus, in response to the first control clock signal RDCLK, the first latency signal RDL, and the second latency signal DODTL.

The termination control unit 109 may be configured to control on-die termination of the transmission unit 110 in response to the first control clock signal RDCLK and the first latency signal RDL, during the read operation of the semiconductor apparatus.

The termination control unit 109 may be configured to control dynamic on-die termination of the transmission unit 110 in response to the second latency signal DODTL, during the write operation of the semiconductor apparatus.

FIG. 9 is a circuit diagram of the command control unit 202 of FIG. 8.

Referring to FIG. 9, the command control unit 202 may include a command decoder 111, an inverter 212, and logic circuits 213 and 214.

The command decoder 111 may be configured to decode the column address strobe signal CAS, the row address strobe signal RAS, and the write enable signal WE and generate an active command ACT, a read command RD, and a write command WT.

At this time, when the column address strobe signal CAS, the active command ACT, and the write enable signal WE are activated to a high level, the read command RD may be activated. Furthermore, when the column address strobe signal CAS and the active command ACT are activated to a high level and the write enable signal WE is deactivated to a low level, the write command WT may be activated.

The inverter 212 may be configured to invert the write enable signal WE and generate the inverted write enable signal WEb.

The logic circuit 213 may be configured to perform an AND operation on the active command ACT, the column address strobe signal CAS, and the inverted write enable signal WEb, and generate the read strobe signal PRD when the operation result is at a high level.

The logic circuit 214 may be configured to perform an AND operation on the active command ACT, the column address strobe signal CAS, and the write enable signal WE, and generate the write strobe signal PWT when the operation result is at a high level.

That is, the command control unit 202 may activate only the read strobe signal PRD between the read strobe signal PRD and the write strobe signal PWT during the read operation, and activate only the write strobe signal PWT between the read strobe signal PRD and the write strobe signal PWT during the write operation.

Figure 10:
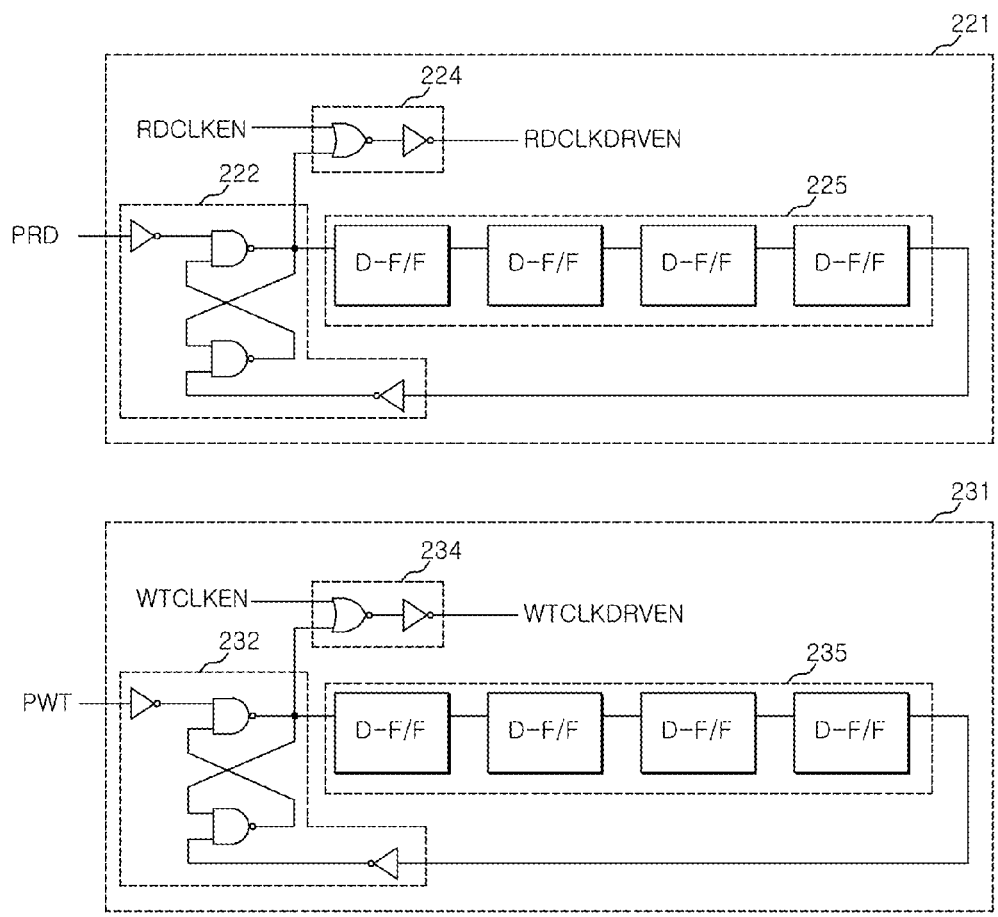
FIG. 10 is a circuit diagram of a clock enable signal generation unit 203 of FIG. 8.

FIG. 10 is a circuit diagram of the clock enable signal generation unit 203 of FIG. 8.

Referring to FIG. 10, the clock enable signal generation unit 203 may include a first signal generator 221 and a second signal generator 231.

The first signal generator 221 may be configured to generate the read clock enable signal RDCLKDRVEN in response to the read strobe signal PRD and the read period signal RDCLKEN.

The first signal generator 221 may include a latch 222, a logic circuit 224, and a flip-flop array 225 with flip-flops D-F/F.

The latch 222 may be configured to set an output signal thereof in response to the read strobe signal PRD and reset the output signal after a delay time by the flip-flop array 225.

The logic circuit 224 may be configured to perform an OR operation on the output signal of the latch 222 and the read period signal RDCLKEN and generate the read clock enable signal RDCLKDRVEN.

The second signal generator 231 may be configured to generate the write clock enable signal WTCLKDRVEN in response to the write strobe signal PWT and the write period signal WTCLKEN.

The second signal generator 231 may include a latch 232, a logic circuit 234, and a flip-flop array 235 with flip-flops D-F/F.

The latch 232 may be configured to set an output signal thereof in response to the write strobe signal PWT and reset the output signal after a delay time by the flip-flop array 235.

The logic circuit 234 may be configured to perform an OR operation on the output signal of the latch 232 and the write period signal WTCLKEN and generate the write clock enable signal WTCLKDRVEN.

The other components excluding the command control unit 202 and the clock enable signal generation unit 203, that is, the DLL 101, the clock control unit 104, the delay unit 105, the first latency shifter 107, the second latency shifter 108, the termination control unit 109, and the transmission unit 110 may be configured in the same manner as illustrated in FIG. 1.

Figure 11:
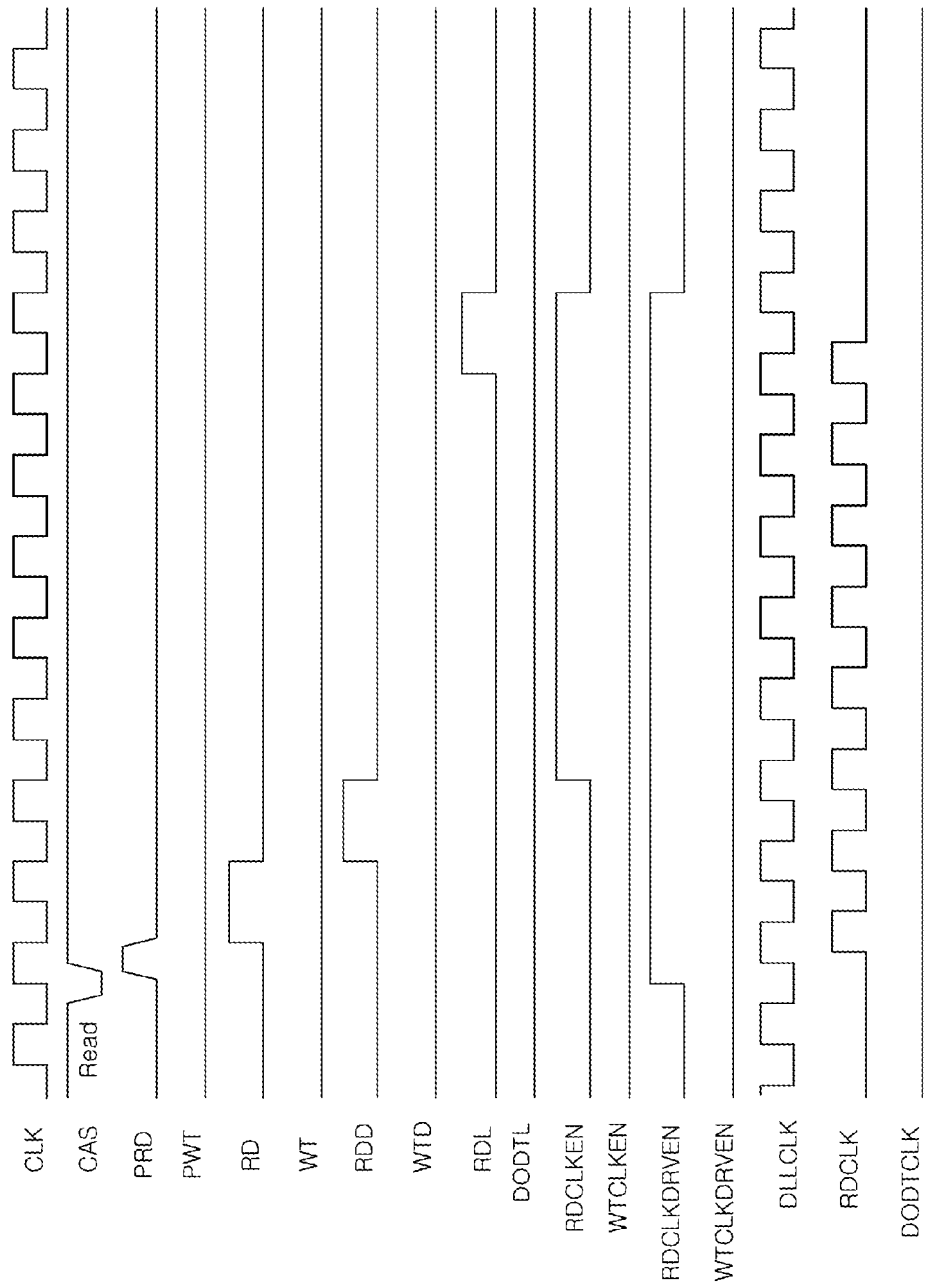
FIG. 11 is a timing diagram of a read operation based on FIG. 8.

FIG. 11 is a timing diagram of the read operation based on FIG. 8.

The read operation of the semiconductor apparatus 200 according to an embodiment of the present invention will be described with reference to FIG. 11.

When a combination of external signals CAS, RAS, and WE defines the read operation, the command control unit 202 may generate the read strobe signal PRD and the read command RD.

The clock enable signal generation unit 203 may activate the read clock enable signal RDCLKDRVEN in response to the read strobe signal PRD.

At this time, since the write strobe signal PWT may be deactivated, the write cock enable signal WTCLKDRVEN may maintain a deactivated state.

The delay unit 105 may generate the delayed read command RDD in response to the read command RD.

The clock control unit 104 may output clock signals, which correspond to an activation period of the read clock enable signal RDCLKDRVEN in the DLL clock signal DLLCLK, as the first control clock signal RDCLK.

At this time, the write clock enable signal WTCLKDRVEN is deactivated. Thus, the clock control unit 104 may block the generation of the second control clock signal DODTCLK.

That is, during the read operation of the semiconductor apparatus, toggling of the second control clock signal DODTCLK may be prevented.

The first latency shifter 107 may shift the delayed read command RDD and generate the first latency signal RDL and the read period signal RDCLKEN.

The activation period of the read clock enable signal RDCLKDRVEN may be extended to the activation period of the read period signal RDCLKEN.

That is, the read clock enable signal RDCLKDRVEN has an activation period ranging from the activation start time of the read strobe signal PRD to the activation end time of the first latency signal RDL.

The termination control unit 109 may control the termination of the transmission unit 110 during the read operation of the semiconductor apparatus, that is, on-die termination in response to the first latency signal RDL and the first control clock signal RDCLK.

As described above, the semiconductor apparatus 200 according to an embodiment of the present invention may prevent toggling of the write operation-related clock signal, that is, the second control clock signal DODTCLK during the read operation, thereby reducing current consumption.

Figure 12:
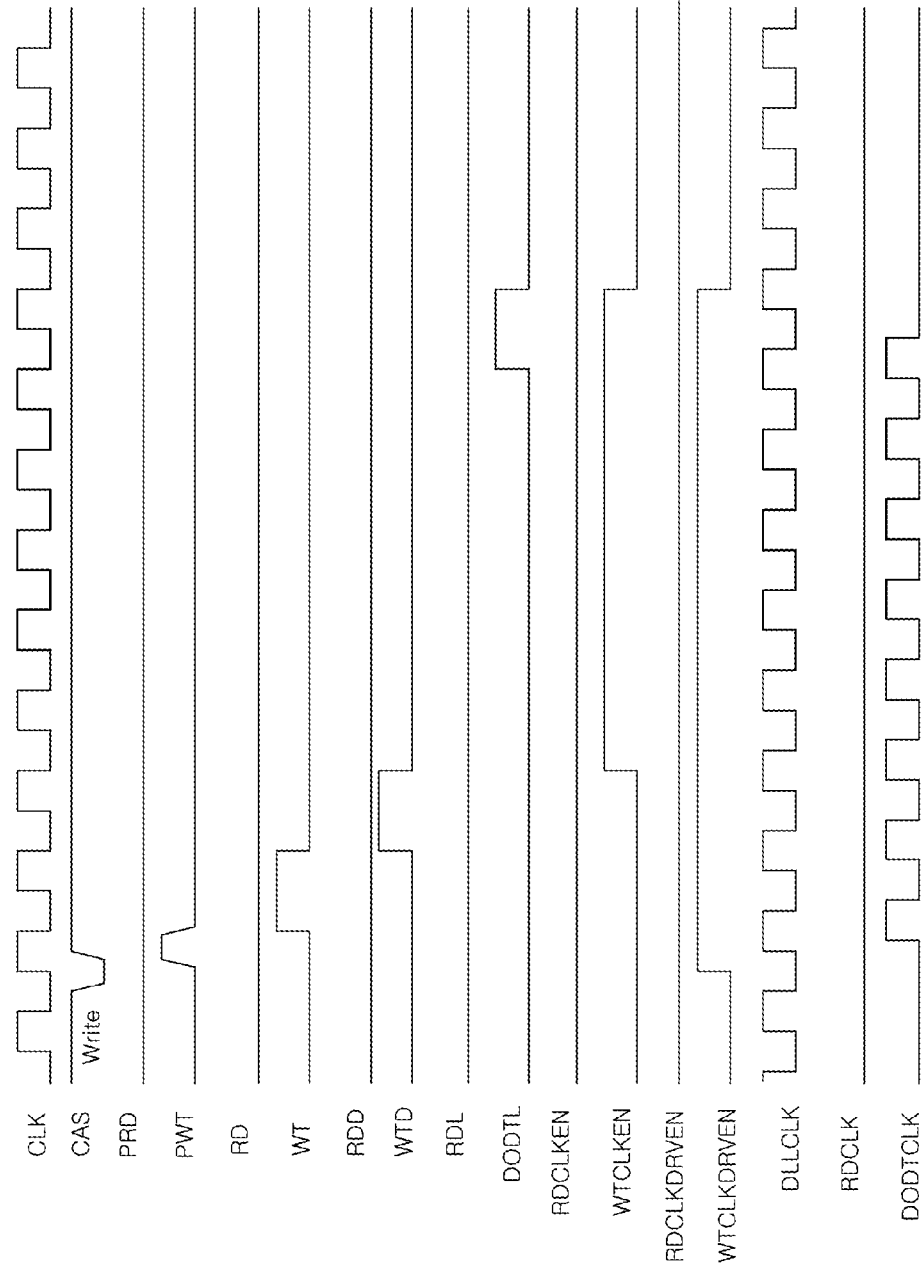
FIG. 12 is a timing diagram of a write operation based on FIG. 8.

FIG. 12 is a timing diagram of the write operation based on FIG. 8.

The write operation of the semiconductor apparatus 200 according to an embodiment of the present invention will be described with reference to FIG. 12.

When a combination of external signals CAS, RAS, and WE defines the write operation, the command control unit 102 may generate the write strobe signal PWT and the write command WT.

The clock enable signal generation unit 203 may activate the write clock enable signal WTCLKDRVEN in response to the write strobe signal PWT.

At this time, since the read strobe signal PRD may be deactivated, the read clock enable signal RDCLKDRVEN may maintain a deactivated state.

The delay unit 105 may generate the delayed write command WTD in response to the write command WT.

The clock control unit 104 may output clock signals, which correspond to the activation period of the write clock enable signal WTCLKDRVEN in the DLL clock signal DLLCLK, as the second control clock signal DODTCLK.

At this time, the read clock enable signal RDCLKDRVEN is deactivated. Thus, the clock control unit 104 may block the generation of the first control clock signal RDCLK.

That is, during the write operation of the semiconductor apparatus, toggling of the first control clock signal RDCLK may be prevented.

The second latency shifter 107 may shift the delayed write command WTD and generate the second latency signal DODTL and the write period signal WTCLKEN.

The activation period of the write clock enable signal WTCLKDRVEN may be extended to the activation period of the write period signal WTCLKEN.

That is, the write clock enable signal WTCLKDRVEN may have an activation period ranging from the activation start time of the write strobe signal PWT to the activation end time of the second latency signal DODTL.

The termination control unit 109 may control the termination of the transmission unit 110 during the write operation of the semiconductor apparatus, that is, dynamic on-die termination in response to the second latency signal DODTL and the second control clock signal DODTCLK.

As described above, the semiconductor apparatus 200 according to an embodiment of the present invention may prevent toggling of the read operation-related clock signal, that is, the first control clock signal RDCLK during the write operation, thereby reducing current consumption.

According to the embodiments of the present invention, it is possible to reduce the current consumption of the semiconductor apparatus.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
   a command control unit configured to decode external signals and generate a read strobe signal or a write strobe signal;
   a clock enable signal generation unit configured to activate one of a read clock enable signal and a write clock enable signal in response to the read strobe signal or the write strobe signal; and
   a clock control unit configured to generate a first control clock signal and a second clock control signal in response to an internal clock signal, the read clock enable signal, and the write clock enable signal,
   wherein the clock enable signal generation unit is configured to activate the read clock enable signal and deactivate the write clock enable signal in response to the read strobe signal.

2. The semiconductor apparatus according to claim 1, further comprising:
   a delay locked loop (DLL) configured to receive an external clock signal and generate the internal clock signal for compensating for an internal signal processing delay time of the semiconductor apparatus.

3. The semiconductor apparatus according to claim 1, further comprising:
   a latency shift unit configured to generate a first latency signal in response to a delayed read command and the first control clock signal and generate a second latency signal in response to a delayed write command and the second control clock signal.

4. The semiconductor apparatus according to claim 1, wherein the external signals comprise a column address strobe signal, a row address strobe signal, and a write enable signal.

5. The semiconductor apparatus according to claim 1, wherein the command control unit comprises:
   a command decoder configured to decode the external signals and generate an active command, a read command, and a write command;
   a first logic circuit configured to combine the active command, the column address strobe signal, and the inverted write enable signal and generate the read strobe signal; and
   a second logic circuit configured to combine the active command, the column address strobe signal, and the write enable signal and generate the write strobe signal.

6. The semiconductor apparatus according to claim 1, wherein the clock enable signal generation unit is configured to generate the read clock enable signal in response to the read strobe signal and a read period signal and generate the write clock enable signal in response to the write strobe signal and a write period signal.

7. The semiconductor apparatus according to claim 1, wherein the clock enable signal generation unit is configured to activate the write clock enable signal and deactivate the read clock enable signal in response to the write strobe signal.

8. The semiconductor apparatus according to claim 3, wherein the latency shift unit is configured to generate the first latency signal and the read period signal in response to the delayed read command and the first control clock signal, and generate the second latency signal and the write period signal in response to the delayed write command and the second control clock signal.

9. The semiconductor apparatus according to claim 1, further comprising:
   a transmission unit configured to perform a data driving operation corresponding to a read command; and a termination control unit configured to control termination of the transmission unit during read and write operations of the semiconductor apparatus, in response to the first control clock signal, the first latency signal, and the second latency signal.

10. The semiconductor apparatus according to claim 9, wherein the termination control unit is configured to control on-die termination of the transmission unit in response to the first control clock signal and the first latency signal, during the read operation of the semiconductor apparatus.

11. The semiconductor apparatus according to claim 9, wherein the termination control unit is configured to dynamic on-die termination of the transmission unit in response to the second latency signal, during the write operation of the semiconductor apparatus.

12. The semiconductor apparatus according to claim 1, wherein the clock enable signal generation unit comprises:
a first signal generator configured to generate the read clock enable signal in response to the read strobe signal and a read period signal; and
a second signal generator configured to generate the write clock enable signal in response to the write strobe signal and a write period signal.

13. The semiconductor apparatus according to claim 12, wherein the first signal generator comprises:
a flip-flop array;
a latch configured to set an output signal thereof in response to the read strobe signal and reset the output signal after a delay time by the flip-flop array; and
a logic circuit configured to combine the output signal of the latch and the read period signal and generate the read clock enable signal.

14. The semiconductor apparatus according to claim 12, wherein the second signal generator comprises:
a flip-flop array;
a latch configured to set an output signal thereof in response to the write strobe signal and reset the output signal after a delay time by the flip-flop array; and
a logic circuit configured to combine the output signal of the latch and the write period signal and generate the write clock enable signal.

15. The semiconductor apparatus according to claim 1, wherein the command control unit is configured to active only the read strobe signal between the read strobe signal and the write strobe signal during the read operation of the semiconductor apparatus.

16. The semiconductor apparatus according to claim 1, wherein the clock control unit is configured to output a part of clock pulses of the internal clock signal as the first clock control signal during the read operation of the semiconductor apparatus,
wherein the part of clock pulses correspond to an activation period of the read clock enable signal.

17. The semiconductor apparatus according to claim 1, wherein the command control unit is configured to activate only the write strobe signal between the read strobe signal and the write strobe signal during the write operation of the semiconductor apparatus.

18. The semiconductor apparatus according to claim 1, wherein the clock control unit is configured to output a part of clock pulses of the internal clock signal as the second clock control signal during the write operation of the semiconductor apparatus,
wherein the part of clock pulses correspond to an activation period of the write clock enable signal.

* * * * *